United States Patent [19]

Kokado et al.

[11] Patent Number: 4,631,567
[45] Date of Patent: Dec. 23, 1986

[54] PNPN INTEGRATED CIRCUIT PROTECTIVE DEVICE WITH INTEGRAL RESISTOR

[75] Inventors: Masayuki Kokado, Kawasaki; Hidezi Sumi, Yokohama, both of Japan

[73] Assignee: Fujitsu Limited, Kawasaki, Japan

[21] Appl. No.: 693,306

[22] Filed: Jan. 23, 1985

Related U.S. Application Data

[63] Continuation of Ser. No. 543,215, Oct. 19, 1983, abandoned, which is a continuation of Ser. No. 221,330, Dec. 29, 1980, abandoned.

[30] Foreign Application Priority Data

Dec. 27, 1979 [JP] Japan .................................. 54-169181

[51] Int. Cl.⁴ ........................................... H01L 29/74
[52] U.S. Cl. .................................... 357/38; 357/23.13; 357/51; 357/46; 357/86; 361/56; 361/91
[58] Field of Search ................... 357/38, 23.13, 51, 86, 357/46; 361/56, 91

[56] References Cited

U.S. PATENT DOCUMENTS

| 3,664,893 | 5/1972 | Frazee | 357/38 |
| 3,795,828 | 3/1974 | Cavaliere et al. | 357/86 |
| 3,990,092 | 11/1976 | Yoshimura | 357/86 |
| 4,321,524 | 3/1982 | Petrovic | 307/318 |

FOREIGN PATENT DOCUMENTS

| 1919203 | 11/1969 | Fed. Rep. of Germany | 307/318 |
| 2951421 | 9/1980 | Fed. Rep. of Germany | 357/23.13 |

OTHER PUBLICATIONS

D. Goldthorp et al., "An Integrated Circuit Composite PNPN Diode," IEEE IEDM, Dec. 3-5, 1979, pp. 180-183.

W. Davis, "Bipolar Design Considerations for the Automative Environ.," IEEE J. of S.-S., Ckts., vol. SC-8 #6, Dec. 1973, pp. 419-426.

Primary Examiner—Joseph E. Clawson, Jr.
Attorney, Agent, or Firm—Staas & Halsey

[57] ABSTRACT

A semiconductor device comprises an internal circuit and an electrostatic destruction preventing circuit connected between a predetermined electrical potential point and a signal input terminal with respect to the internal circuit. The electrostatic destruction preventing circuit comprises a PNP-transistor having its emitter connected to the predetermined electrical potential point, an NPN-transistor having its emitter connected to said signal input terminal and said internal circuit, collector connected to the base of the PNP-transistor, and base connected to the collector of said PNP-transistor, and a resistor connected between the base of the PNP-transistor and the base of the NPN-transistor.

4 Claims, 4 Drawing Figures

PNPN INTEGRATED CIRCUIT PROTECTIVE DEVICE WITH INTEGRAL RESISTOR

This is a continuation of co-pending application Ser. No. 543,215 filed on Oct. 19, 1983, which is a continuation of application Ser. No. 221,330, filed Dec. 29, 1980, abandoned.

BACKGROUND OF THE INVENTION

The present invention generally relates to semiconductor devices, and more particularly to a semiconductor device having a circuit construction capable of preventing destruction of the device due to static electricity, and suitable for applicaton to bipolar integrated circuits.

Generally, accompanied by the developments in the Large Scale Integrated (LSI) circuits, bipolar elements for constructing a bipolar integrated circuit are further miniaturized year by year. However, as the bipolar elements are further miniaturized, the elements are more easily destroyed by static electricity which is inevitably introduced upon handling of the elements. Accordingly, measures to prevent the electrostatic destruction are being stressed.

Thus, conventionally, as a measure to prevent the electrostatic destruction, a circuit construction has been used in which the cathode of a diode is connected between the input pad of the integrated circuit and the input transistor, for example, and the anode of the diode is connected to the power source. The input transistor of a CML or ECL circuit which requires high performances, is generally an NPN-transistor. When a positive electrostatic pulse is applied to the input pad, the input transistor is not destroyed by the electrostatic pulse since the electrostatic pulse is in the forward direction with respect to the base-collector junction of the input transistor. However, when a negative electrostatic pulse is applied to the input pad, the input transistor is reverse-biased, and when the above diode is not provided, the junction of the input transistor is destroyed in a case where the electrostatic pulse is large. In a case where the above diode is connected, however, the diode becomes active when a negative electrostatic pulse is applied to the input pad, and the large instantaneous current which flows at the initial stage when the negative electrostatic pulse is applied, flows toward the input pad through the diode. Hence, the distribution of the input transistor is prevented.

However, as the performance of the integrated circuit itself becomes higher and higher, the following notable disadvantages are introduced by use of the conventional circuit described above. That is, a large voltage is generated between the terminals of the diode due to an internal resistance of the diode when the large instantaneous current flows at the initial stage of applying the electrostatic pulse, and a desirable destruction preventing effect cannot be expected since the input transistor could possibly be destroyed. Therefore, a diode having a large surface area must be used in order to reduce the internal resistance of the diode. But on the other hand, this type of a diode having a large surface area comprises a large junction capacitance. Accordingly, when this type of a diode is used, although the internal resistance of the diode is small, the input signal waveform is distorted due to the large junction capacitance of the diode, and is disadvantageous in that the high-speed operation of the integrated circuit is disturbed.

Hence, accompanied by the upgrading in the high performance of the integrated circuits, the realization of a measure for preventing electrostatic destruction of a device which does not use the above diode, is highly desired.

SUMMARY OF THE INVENTION

Accordingly, a general object of the present invention is to provide a novel and useful semiconductor device having an electrostatic destruction preventing circuit, in which the above described problems have been overcome.

Another and more specific object of the present invention is to provide a semiconductor device having an electrostatic destruction preventing circuit which has small internal resistance and a small capacitive component. According to the device of the present invention, a large voltage is not generated even upon the initial stage when the electrostatic pulse is applied, since the internal resistance is small, and the large instantaneous current can rapidly be discharged. Moreover, the high-speed operation of the integrated circuit can be achieved, due to the small capacitive component of the electrostatic destruction preventing circuit.

Still another object of the present invention is to provide a semiconductor device having an electrostatic destruction preventing circuit comprising a PNP-transistor having its emitter connected to a predetermined electric potential point, an NPN-transistor having its emitter connected to a signal input terminal and an internal circuit, collector connected to the base of said PNP-transistor, and base connected to the collector of said PNP-transistor, and a resistor connected between the base of said PNP-transistor and the base of said NPN-transistor. According to the device of the present invention, when a negative electrostatic pulse is applied, a large instantaneous current due to the negative electrostatic pulse flows in the direction of the signal input terminal through the electrostatic destruction preventing circuit, and thus, destruction of the internal circuit due to the static electricity is prevented.

Other objects and further features of the present invention will be apparent from the following detailed description when read in conjunction with the accompanying drawings.

DETAILED DESCRIPTION OF THE PREFERRED EMBODIMENT

Figure 1:
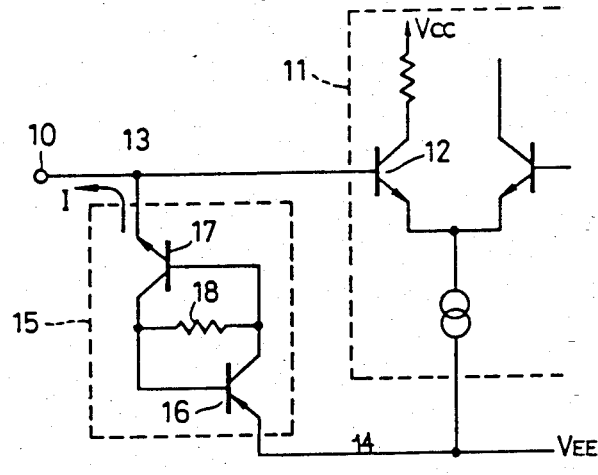
FIG. 1 is an equivalent circuit diagram showing an embodiment of a semiconductor device according to the present invention.

In FIG. 1, an electrostatic destruction preventing circuit 15, which forms the essential part of a semiconductor device according to the present invention, is connected between a point 13 and a predetermined electric potential line 14, where the point 13 is located between the base of an input NPN-transistor 12 of an internal circuit 11 and an input terminal 10. The electrostatic destruction preventing circuit 15 comprises a PNP-transistor 16, a NPN-transistor 17, and a resistor 18. The predetermined electric potential line 14 is connected to a most negative power source, and in an actual device, the line 14 is a substrate as will be described hereinafter.

The emitter of the transistor 16 is connected to the line 14, and the emitter of the transistor 17 is connected to the point 13. The base of the transistor 16 and the collector of the transistor 17 are mutually connected, and the base of the transistor 17 and the collector of the transistor 16 are mutually connected. The resistor 18 is connected between the bases of the transistors 16 and 17.

When a positive electrostatic pulse is applied between the input terminal 10 and the line 14, the input transistor 12 is not destroyed by the positive electrostatic pulse since the above positive electrostatic pulse is in the foward direction with respect to the base-collector junction of the input transistor 12. However, when a negative electrostatic pulse is applied between the input terminal 10 and the line 14, the input transistor 12 can be destroyed because the negative electrostatic pulse is in the reverse direction with respect to the base-collector junction of the input transistor 12. Hence, the electrostatic destruction preventing circuit 15 is a circuit for passing the large instantaneous current in the direction of an arrow I of FIG. 1, when the above negative electrostatic pulse is applied between the input terminal 10 and the line 14. The operation of this circuit 15 will now be described.

If the forward direction base-emitter voltages of the PNP-transistor 16 and the NPN-transistor are respectively designated by $V_{BE}(PNP)$ and $V_{BE}(NPN)$, the voltage at which the circuit 15 is turned ON is $V_{BE}(PNP)+V_{BE}(NPN)=2\ V_{BE}$. When a negative electrostatic pulse is applied between the input terminal 10 and the line 14, and the transistor 16 is turned ON, the collector current of the transistor 16 becomes the base current of the transistor 17, and thus, the transistor 17 is rapidly put in a saturated state. Upon saturation of the transistor 17, the difference between the collector voltage and the emitter voltage of the transistor 17 become small, and the collector-emitter voltage $V_{CES}$ when the transistor 17 is saturated is, $V_{CES}<V_{BE}(NPN)$.

Figure 2:
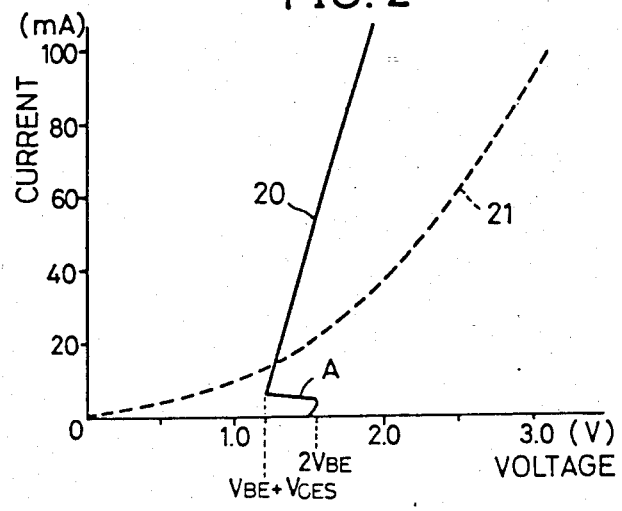
FIG. 2 is a graph showing a voltage versus current characteristic of the device according to the present invention.

The operation of the device of the present invention will be described in conjunction with the characteristic shown in FIG. 2. The circuit 15 is put in an ON state by a voltage equal to $2\ V_{BE}$, and during the process in which the transistor 17 is being saturated, that is, until the voltage reaches a value equal to $V_{BE}+V_{CES}$, the characteristic of the device is in a negative resistance region A. Beyond the point at which the transistor 17 is saturated, the internal resistance becomes small, and the current which flows has a very steep slope characteristic. Accordingly, it can be clearly seen that, when a negative electrostatic pulse is applied between the input terminal 10 and the line 14, the circuit 15 is capable of instantly passing a large current in the direction of the arrow I. Furthermore, when a diode is simply connected as in the above described conventional circuit instead of the circuit 15, the discharge characteristic becomes a smooth curve as shown by a characteristic curve 21 of FIG. 2, due to the bulk resistance of the diode, and thus, not capable of rapidly allowing the current to flow.

Figure 3:
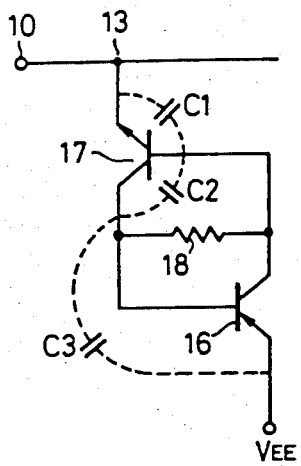
FIG. 3 is a circuit diagram for explaining the capacitance distribution of the device according to the present invention.

The capacitive component of the circuit 15 will now be discussed with reference to FIG. 3. The existence of a capacitance C1 between the emitter and base of the transistor 17, a capacitance C2 between the collector and base of the transistor 17, and a capacitance C3 between the collector of the transistor 17 and its isolation, can be considered as seen in FIG. 3. The sum C of the above capacitances is determined by using the relationship $1/C=1/C1+1/C2+1/C3$, where the sum C of the capacitances is smaller than the smallest capacitance of the three capacitances C1, C2, and C3. The transistor 16 comprises similar capacitive components as that of the transistor 17. However, without considering these capacitive components, it can be seen that the sum of all the capacitive components in the circuit 15 is a small value.

Therefore, the high-speed operation of the internal circuit 11 is not at all affected by the use of the capacitive components of the circuit 15.

Figure 4:
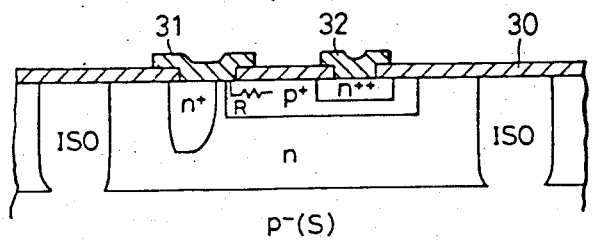
FIG. 4 is a cross-sectional view of the embodiment of the semiconductor device according to the present invention.

An embodiment of a semiconductor device of the present invention showing the above equivalent circuit, will now be described in conjunction with the cross-sectional diagram of FIG. 4. As shown in FIG. 4, an N-type layer, an N+-type region, a P+-type region, and an N++-type region are formed within a region divided by an isolation region ISO which is formed on a P−-type substrate P−(s). An oxidized insulation layer 30 made of silicon dioxide (SiO$_2$), is formed on top of the above layers as shown in FIG. 4. The substrate P−(s) is connected to a most negative power source $V_{EE}$.

The above substrate P−(s), N-type layer, and P+-type region, respecitvely constitute the emitter, base, and collector of the transistor 16, while the N-type layer, P+-type region, and N++-type region respectively constitute the collector, base, and emitter of the transistor 17. Accordingly, the N-type layer is simultaneously used as the base of the transistor 16 and collector of the transistor 17. On the other hand, the P+-type region is simultaneously used as the collector of the transistor 16 and the base of the transistor 17. An electrode 31 is an external wiring to short-circuit the base and collector of the transistor 17. A resistance R shown inside the P+-type region is the external base resistance of the transistor 17, and corresponds to the resistor 18 of FIGS. 1 and 3. An electrode 32 connects the N++-type region which forms the emitter of the transistor 17, to the input terminal 10.

The device of the above described construction performs a vertical PNPN-operation, and hence the series resistance component of the device is small. Accordingly, as described above, the large instantaneous current introduced when a negative electrostatic pulse is applied, can rapidly be passed through.

Further, this invention is not limited to above embodiments but various variations and modifications may be made without departing from the scope of the invention.

What is claimed is:

1. A semiconductor device for receiving an input signal, comprising: a substrate, an internal circuit formed in the substrate and an electrostatic destruction preventing circuit formed in the substrate and connected between a predetermined electrical potential point which is operatively connected to receive a most negative power supply voltage, and having a signal input terminal which is operatively connected to receive the input signal for said internal circuit, wherein said electrostatic destruction preventing circuit comprises:
  a PNP-transistor having a collector region, a base region, and an emitter region connected to said predetermined electrical potential point;
  an NPN-transistor having an emitter region connected to said signal input terminal and to said internal circuit, a collector region connected to the base region of said PNP-transistor, and a base region connected to the collector region of said PNP-transistor; and
  resistor means comprising a portion of the collector region of said PNP-transistor, and the base region of said NPN-transistor.

2. A semiconductor device as claimed in claim 1, wherein said PNP-transistor comprises:
  an emitter comprising a P-type substrate operatively connected to receive said most negative power supply voltage,
  a base region comprising an N-type layer formed in said substrate, and
  a collector region comprising a P-type region formed in said N-type layer; wherein
  said NPN-transistor comprises:
  a collector region comprising said N-type layer,
  a base region comprising said P-type region, and
  an emitter region comprising an N-type region formed in said P-type region, said N-type layer forming the base region of said PNP-transistor and said P-type region forming the base region of said NPN-transistor; and said device further includes
  a wiring layer formed on said substrate
  such that said P-type region forms a resistance between the base region of said PNP-transistor and the base region of said NPN-transistor.

3. A semiconductor device as claimed in claim 1, wherein said device has a voltage versus current characteristic having a negative resistance region when said NPN-transistor is being saturated.

4. A semiconductor device as claimed in claim 2 wherein said N-type layer, said N-type region, said P-type substrate, and said P-type region cooperate to form a vertical PNPN-operation.

* * * * *